US010065882B2

(12) United States Patent
Kim et al.

(10) Patent No.: US 10,065,882 B2
(45) Date of Patent: *Sep. 4, 2018

(54) COMPOSITION FOR FORMING SOLAR CELL ELECTRODE AND ELECTRODE FABRICATED USING THE SAME

(71) Applicant: SAMSUNG SDI CO., LTD., Yongin-si, Gyeonggi-do (KR)

(72) Inventors: Ju Hee Kim, Suwon-si (KR); Seok Hyun Jung, Suwon-si (KR); Min Jae Kim, Suwon-si (KR); Seak Cheol Kim, Suwon-si (KR); Sang Hyun Yang, Suwon-si (KR)

(73) Assignee: SAMSUNG SDI CO., LTD., Yongin-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/592,345

(22) Filed: May 11, 2017

(65) Prior Publication Data

US 2017/0327410 A1 Nov. 16, 2017

(30) Foreign Application Priority Data

May 13, 2016 (KR) .................. 10-2016-0059128

(51) Int. Cl.
| | | |
|---|---|---|
| *H01B 1/16* | (2006.01) | |
| *C03C 8/00* | (2006.01) | |
| *C03C 8/18* | (2006.01) | |
| *H01L 31/0224* | (2006.01) | |
| *C03C 8/02* | (2006.01) | |

(Continued)

(52) U.S. Cl.
CPC ................. *C03C 8/18* (2013.01); *C03C 8/02* (2013.01); *C03C 8/04* (2013.01); *H01B 1/16* (2013.01); *H01B 1/22* (2013.01); *H01L 31/022425* (2013.01)

(58) Field of Classification Search
CPC ... H01B 1/00; H01B 1/16; H01B 1/22; C09D 5/24; H01L 31/0224; H01L 35/14; H01L 35/24
See application file for complete search history.

(56) References Cited

U.S. PATENT DOCUMENTS

| | | | |
|---|---|---|---|
| 7,488,434 B2 * | 2/2009 | Kuo ......................... | H01B 1/22 241/23 |
| 8,623,500 B2 * | 1/2014 | Ogawa ...................... | C09C 1/62 428/323 |

(Continued)

FOREIGN PATENT DOCUMENTS

| | | |
|---|---|---|
| JP | 2012-084585 A | 4/2012 |
| TW | 201534570 A | 9/2015 |

OTHER PUBLICATIONS

Power Chemical Corp. SiSiB La0333 Additive data sheet 2008 (Year: 2008).*

(Continued)

*Primary Examiner* — Mark Kopec
(74) *Attorney, Agent, or Firm* — Lee & Morse, P.C.

(57) ABSTRACT

A composition for solar cell electrodes, a solar cell electrode, and a solar cell, the composition including silver powder; glass frit; an organic vehicle; and an epoxy group-containing silicon compound, wherein the glass frit includes bismuth and tellurium, and the organic vehicle includes a cellulose resin.

9 Claims, 1 Drawing Sheet

US 10,065,882 B2

Page 2

(51) Int. Cl.
*C03C 8/04* (2006.01)
*H01B 1/22* (2006.01)

(56) References Cited

U.S. PATENT DOCUMENTS

| 8,986,575 B2* | 3/2015 | Akiba | C09D 11/10 |
| | | | 106/31.92 |
| 2014/0319430 A1* | 10/2014 | Chae | H01L 31/02242 |
| | | | 252/514 |
| 2015/0194545 A1* | 7/2015 | Kozicki | C25D 5/54 |
| | | | 136/256 |
| 2015/0364622 A1* | 12/2015 | Jung | H01L 31/02242 |
| | | | 252/514 |
| 2017/0092788 A1* | 3/2017 | Song | H01L 31/02242 |

OTHER PUBLICATIONS

TEGO journal Evonik Slip and Low Additives data sheet 2014 (Year: 2014).*
Dow Corning product sheet :Silicone Additives for Electronics Materials from Dow Corning (Year: 2012).*
Provisional double patenting rejection over claims of the above-identified application; USPTO Office action dated Sep. 20, 2017, in U.S. Appl. No. 14/964,705.
Office Action dated Dec. 6, 2017 in the corresponding Taiwanese Patent Application No. 106115693.

* cited by examiner (A)    (B)    (C)

COMPOSITION FOR FORMING SOLAR CELL ELECTRODE AND ELECTRODE FABRICATED USING THE SAME

CROSS-REFERENCE TO RELATED APPLICATION

Korean Patent Application No. 10-2016-0059128, filed on May 13, 2016, in the Korean Intellectual Property Office, and entitled: "Composition for Forming Solar Cell Electrode and Electrode Fabricated Using the Same," is incorporated by reference herein in its entirety.

FIELD

Embodiments relate to a composition for solar cell electrodes and an electrode fabricated using the same.

DESCRIPTION OF THE RELATED ART

Solar cells generate electricity using the photovoltaic effect of a p-n junction that converts photons of, e.g., sunlight, into electricity. A silicon-based solar cell may be composed of a substrate formed of a p-type silicon semiconductor and an emitter layer formed of an n-type silicon semiconductor. A p-n junction may be formed between the p-type substrate and the n-type emitter layer. When light is incident on the solar cell having such a structure, electrons may be generated as carriers in the emitter layer formed of the n-type silicon semiconductor and holes may be generated as carriers in the substrate formed of the p-type silicon semiconductor due to the photovoltaic effect. The electrons and holes generated due to the photovoltaic effect may move to a front electrode and a rear electrode bonded to upper and lower surfaces of the emitter layer, respectively, and current flows when these electrodes are connected to each other by a wire.

As the composition for solar cell electrodes, a conductive paste composition including a conductive powder, a glass frit, and an organic vehicle may be used. The glass fit may dissolve an antireflection film formed on a semiconductor wafer such that the conductive powder can be brought into electrical contact with the semiconductor substrate.

SUMMARY

Embodiments are directed to a composition for solar cell electrodes and an electrode fabricated using the same.

The embodiments may be realized by providing a composition for solar cell electrodes, the composition including silver powder; glass frit; an organic vehicle; and an epoxy group-containing silicon compound, wherein the glass fit includes bismuth and tellurium, and the organic vehicle includes a cellulose resin.

The cellulose resin may include hydroxy cellulose, methyl cellulose, ethyl cellulose, or nitrocellulose.

A weight ratio of the cellulose resin to the epoxy group-containing silicon compound may be about 3:7 to about 8:2.

The epoxy group-containing silicon compound may be present in an amount of about 0.2 wt % to about 0.6 wt %, based on a total weight of the composition.

The glass frit may further include at least one of lithium and zinc.

The glass frit may include Bi—Te—Li—O glass frit, Bi—Te—Zn—O glass frit, or Bi—Te—Li—Zn—O glass frit.

The composition may include about 60 wt % to about 95 wt % of the silver powder; about 0.1 wt % to about 20 wt % of the glass frit; about 1 wt % to about 30 wt % of the organic vehicle; and about 0.2 wt % to about 0.6 wt % of the epoxy group-containing silicon compound, all wt % being based on a total weight of the composition.

The composition for solar cell electrodes may further include a dispersant, a thixotropic agent, a plasticizer, a viscosity stabilizer, an anti-foaming agent, a pigment, a UV stabilizer, an antioxidant, or a coupling agent.

The embodiments may be realized by providing a solar cell electrode prepared from the composition for solar cell electrodes according to an embodiment.

The embodiments may be realized by providing a solar cell including the solar cell electrode according to an embodiment.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
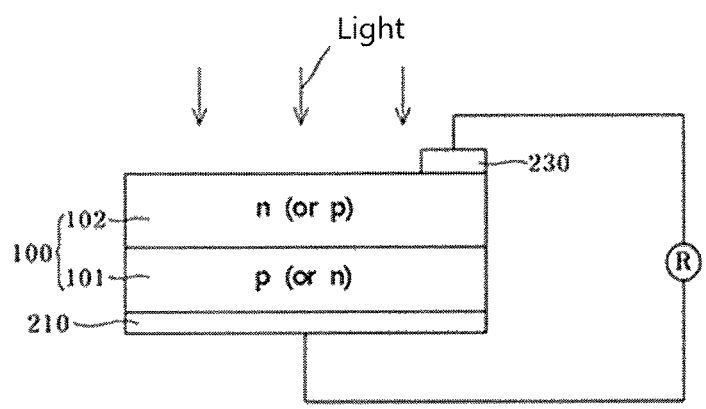
FIG. 1 illustrates a schematic view of a solar cell according to one embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or element, it can be directly on the other layer or element, or intervening layers may also be present. In addition, it will also be understood that when a layer is referred to as being "between" two layers, it can be the only layer between the two layers, or one or more intervening layers may also be present. Like reference numerals refer to like elements throughout. As used herein, the term "or" is not an exclusive term, e.g., "A or B" would include A, B, or any combination of A and B.

Composition for Solar Cell Electrodes

A composition for solar cell electrodes according to an embodiment may include, e.g., silver powder, a glass frit, an organic vehicle, and an epoxy group-containing silicon compound. In an implementation, the glass frit may contain, e.g., bismuth and tellurium, and the organic vehicle may include, e.g., a cellulose resin.

Now, each component of the composition for solar cell electrodes according to an embodiment will be described in more detail.

(1) Silver Powder

The composition for solar cell electrodes according to an embodiment may include, e.g., silver (Ag) powder as a conductive powder. The silver powder may have a nanometer or micrometer-scale particle size. For example, the silver powder may have a particle size of dozens to several hundred nanometers, or a particle diameter of several to dozens of micrometers. In an implementation, the silver powder may be a mixture of two or more types of silver powder having different particle sizes.

In an implementation, the silver powder may have various particle shapes, e.g., a spherical, flake, or amorphous particle shape.

In an implementation, the silver powder may have an average particle diameter (D50) of about 0.1 μm to about 10 μm, e.g., about 0.5 μm to about 5 μm. Within this range of average particle diameter, it is possible to help reduce contact resistance and line resistance. The average particle diameter may be measured using, e.g., a Model 1064D (CILAS Co., Ltd.) after dispersing the silver powder in isopropyl alcohol (IPA) at 25° C. for 3 minutes via ultrasonication.

The silver powder may be present in an amount of about 60 wt % to about 95 wt %, based on a total weight of the composition for solar cell electrodes. Within this range, the composition may help improve conversion efficiency of a solar cell and may be easily prepared in paste form. In an implementation, the silver powder may be present in an amount of about 70 wt % to about 90 wt %, based on the total weight of the composition.

(2) Glass Frit

The glass frit may form silver crystal grains in an emitter region by etching an anti-reflection layer and melting the silver powder during a baking process of the composition for solar cell electrodes. The glass frit may help improve adhesion of the silver powder to a wafer and may be softened during the baking process, thus decreasing baking temperature.

In an implementation, the glass frit may include a bismuth-tellurium-oxide (Bi—Te—O) glass frit including bismuth and tellurium. For example, the glass frit may include about 25 mol % to about 85 mol % of tellurium (Te), wherein a molar ratio of bismuth (Bi) to tellurium (Te) ranges from about 1:0.1 to about 1:50. When the molar ratio of bismuth to tellurium falls within the above range, it is possible to help minimize reduction in adhesion of an electrode to a substrate while securing low resistance.

In an implementation, the glass fit may further include a metal and/or a metal oxide in addition to bismuth and tellurium. In an implementation, the glass fit may further include lithium (Li), zinc (Zn), lead (Pb), phosphorus (P), germanium (Ge), gallium (Ga), cerium (Ce), iron (Fe), silicon (Si), tungsten (W), magnesium (Mg), cesium (Cs), strontium (Sr), molybdenum (Mo), titanium (Ti), tin (Sn), indium (In), vanadium (V), barium (Ba), nickel (Ni), copper (Cu), sodium (Na), potassium (K), arsenic (As), cobalt (Co), zirconium (Zr), manganese (Mn), or oxides thereof. In an implementation, the glass frit may further include lithium (Li) or zinc (Zn).

In an implementation, the glass frit may include a bismuth-tellurium-lithium-oxide (Bi—Te—Li—O) glass frit including bismuth, tellurium, and lithium. For example, the glass frit may include about 1 mol % to about 20 mol % of bismuth, about 25 mol % to about 85 mol % of tellurium, and about 5 mol % to about 30 mol % of lithium.

In an implementation, the glass frit may include a bismuth-tellurium-zinc-oxide (Bi—Te—Zn—O) glass frit including bismuth, tellurium, and zinc. For example, the glass frit may include about 1 mol % to about 20 mol % of bismuth, about 25 mol % to about 85 mol % of tellurium, and about 10 mol % to about 30 mol % of zinc.

In an implementation, the glass frit may include a bismuth-tellurium-lithium-zinc-oxide (Bi—Te—Li—Zn—O) glass frit including bismuth, tellurium, lithium, and zinc. For example, the glass frit may include about 1 mol % to about 15 mol % of bismuth, about 25 mol % to about 85 mol % of tellurium, about 5 mol % to about 30 mol % of lithium, about 10 mol % to about 30 mol % of zinc.

The glass frit may be prepared by a suitable method. For example, the glass fit may be prepared by mixing the above-described components using a ball mill or a planetary mill, melting the mixture at about 900° C. to about 1,300° C., and quenching the melted mixture to 25° C., followed by pulverizing the obtained product using a disk mill, a planetary mill, or the like.

In an implementation, the glass fit may have an average particle diameter (D50) of, e.g., about 0.1 μm to about 10 μm. In an implementation, the glass fit may have various shapes, e.g., a spherical or amorphous shape.

In an implementation, the glass fit may be present in an amount of about 0.5 wt % to about 20 wt %, e.g., about 3 wt % to about 15 wt %, based on the total weight of the composition for solar cell electrodes. Within this range, the glass frit may help secure stability of a p-n junction under various sheet resistances, may help minimize series resistance, and may help ultimately improve solar cell efficiency.

(3) Organic Vehicle

The organic vehicle may impart suitable viscosity and rheological characteristics for printing to the composition for solar cell electrodes through mechanical mixing with the inorganic component of the composition.

The organic vehicle may include, e.g., an organic binder and a solvent.

In an implementation, the organic binder may be, e.g., a cellulose resin. In an implementation, the cellulose resin may include, e.g., hydroxy cellulose, methyl cellulose, ethyl cellulose, or nitrocellulose.

The cellulose resin may have excellent injection moldability, as compared with an acrylic or epoxy resin and thus may be advantageous in fine line width printing.

The organic binder may be present in an amount of, e.g., about 0.1 wt % to about 5 wt %, based on the total weight of the composition for solar cell electrodes.

The solvent may include, e.g., hexane, toluene, ethyl cellosolve, cyclohexanone, butyl cellosolve, butyl carbitol (diethylene glycol monobutyl ether), dibutyl carbitol (diethylene glycol dibutyl ether), butyl carbitol acetate (diethylene glycol monobutyl ether acetate), propylene glycol monomethyl ether, hexylene glycol, terpineol, methylethylketone, benzylalcohol, γ-butyrolactone, or ethyl lactate. These may be used alone or as a mixture thereof.

The organic vehicle may be present in an amount of, e.g., about 1 wt % to about 30 wt %, based on the total weight of the composition for solar cell electrodes. Within this range, the organic vehicle may help provide sufficient adhesive strength and excellent printability to the composition.

(4) Epoxy Group-Containing Silicon Compound

The composition for solar cell electrodes according to an embodiment may include an epoxy group-containing silicon compound. When the composition includes the epoxy group-containing silicon compound, due to rapid curability of the silicon compound, the composition for solar cell electrodes may be rapidly cured during formation of an electrode and allows formation of a firm film, thereby improving adhesion between the electrode and a substrate. In addition, leveling properties of the composition may be improved by the epoxy group contained in the silicon compound, such that occurrence of disconnection may be remarkably reduced when the composition is printed with a fine line width.

The epoxy group-containing silicon compound may be present in an amount of, e.g., about 0.2 wt %, about 0.3 wt %, about 0.4 wt %, about 0.5 wt %, or about 0.6 wt %, based on the total weight of the composition for solar cell electrodes. In an implementation, the epoxy group-containing silicon compound may be present in an amount ranging from one of the numerical values set forth above to another numerical value set forth above, based on the total weight of the composition for solar cell electrodes. In an implementation, the epoxy group-containing silicon compound may be present in an amount of about 0.2 wt % to about 0.6 wt %, e.g., about 0.3 wt % to about 0.5 wt %, based on the total weight of the composition for solar cell electrodes. When the amount of the epoxy group-containing silicon compound falls within the above range, an electrode fabricated using the composition may exhibit low resistance and excellent adhesion to a substrate.

In the composition according to an embodiment, a weight ratio of the cellulose resin to the epoxy group-containing silicon compound may be, e.g., about 3:7, 4:6, 5:5, 6:4, 7:3, or 8:2. In an implementation, the weight ratio of the cellulose resin to the epoxy group-containing silicon compound may range from one of the numerical values set forth above to another numerical value set forth above. In an implementation, the weight ratio of the cellulose resin to the epoxy group-containing silicon compound may be about 3:7 to about 8:2, e.g., about 4:6 to about 6:4. When the weight ratio of the cellulose resin to the epoxy group-containing silicon compound falls within the above range, it is possible to help maximize adhesion of an electrode to a substrate without deterioration in resistance characteristics.

(5) Additive

The composition for solar cell electrodes according to an embodiment may further include a suitable additive, e.g., to enhance fluidity, process properties, and stability, as desired. The additive may include, e.g., a dispersant, a thixotropic agent, a plasticizer, a viscosity stabilizer, an anti-foaming agent, a pigment, a UV stabilizer, an antioxidant, a coupling agent, or the like. The additive may be used alone or as mixtures thereof. In an implementation, the additive may be present in an amount of, e.g., about 0.1 wt % to about 5 wt %, based on the total weight of the composition for solar cell electrodes.

Solar Cell Electrode and Solar Cell Including the Same

Other embodiments relate to an electrode formed of or prepared from the composition for solar cell electrodes and a solar cell including the same. FIG. 1 illustrates a solar cell in accordance with one embodiment.

Referring to FIG. 1, a rear electrode 210 and a front electrode 230 may be formed by printing the composition for electrodes on a wafer 100 or substrate including a p-layer (or an n-layer) 101 and an n-layer (or a p-layer) 102 as an emitter, followed by baking. For example, a preliminary process of forming the rear electrode may include printing the composition on a back surface of the wafer and drying the printed composition at about 200° C. to about 400° C. for about 10 to 60 seconds. A preliminary process of forming the front electrode may include printing the composition on a front surface of the wafer and drying the printed composition. Then, the front electrode 230 and the rear electrode 210 may be formed by baking the wafer at about 400° C. to about 950° C., e.g., at about 700° C. to about 950° C., for about 30 to 210 seconds.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Preparation of Composition for Solar Cell Electrodes

Compositions for solar cell electrodes were prepared as listed in Table 1 in the following manner.

Examples 1 to 3

As an organic binder (C), ethyl cellulose (STD4, Dow Chemical Company) was sufficiently dissolved in Texanol (Eastman Chemical) (D) at 60° C., and silver powder (AG-5-11F, Dowa Hightech Co., Ltd., $D_{50}$=1.5 μm) (A), Bi—Te—O glass frit (ABT-1, Asahi Glass Company, D50=1.0 μm) (B), an epoxy group-containing silicon compound (AY 42-119, DOW CORNING TORAY: Dimethyl Methyl(3-(oxiranylmethoxy)propyl) Siloxane with phenyl silsesquioxane, hydroxy-term) (E1), a dispersant (BYK102, BYK-chemie) (F), and a thixotropic agent (Thixatrol ST, Elementis Co., Ltd.) (G) were added to the binder solution, followed by mixing and kneading in a 3-roll kneader, thereby preparing a composition for solar cell electrodes.

Comparative Examples 1 to 5

A silicone compound containing no epoxy group (TSR-116, Momentive Performance Materials Korea) (E2) was used instead of the epoxy group-containing silicone compound (E1).

Comparative Examples 6 to 7

An epoxy compound (KSR-177, KUKDO Chemical) (E3) was used instead of the epoxy group-containing silicone compound (E1).

Comparative Examples 8 to 9

An acrylic compound (B-7, Showa Polymer Process Corporation) (E4) was used instead of the epoxy group-containing silicone compound (E1).

TABLE 1

|     | Example | | | Comparative Example | | | | | | | | |
| --- | --- | --- | --- | --- | --- | --- | --- | --- | --- | --- | --- | --- |
|     | 1 | 2 | 3 | 1 | 2 | 3 | 4 | 5 | 6 | 7 | 8 | 9 |
| (A) | 89 | 89 | 89 | 89 | 89 | 89 | 89 | 89 | 89 | 89 | 89 | 89 |
| (B) | 2.5 | 2.5 | 2.5 | 2.5 | 2.5 | 2.5 | 2.5 | 2.5 | 2.5 | 2.5 | 2.5 | 2.5 |
| (C) | 0.5 | 0.5 | 0.5 | 0.5 | 0.5 | 0.5 | 0.5 | 0.5 | 0.5 | 0.5 | 0.5 | 0.5 |
| (D) | 7.0 | 6.8 | 6.6 | 7.1 | 7.0 | 6.8 | 6.6 | 6.4 | 6.8 | 6.4 | 6.8 | 6.4 |
| (E1) | 0.2 | 0.4 | 0.6 | — | — | — | — | — | — | — | — | — |
| (E2) | — | — | — | 0.1 | 0.2 | 0.4 | 0.6 | 0.8 | — | — | — | — |

TABLE 1-continued

| | Example | | | Comparative Example | | | | | | | | |
|---|---|---|---|---|---|---|---|---|---|---|---|---|
| | 1 | 2 | 3 | 1 | 2 | 3 | 4 | 5 | 6 | 7 | 8 | 9 |
| (E3) | — | — | — | — | — | — | — | — | 0.4 | 0.8 | — | — |
| (E4) | — | — | — | — | — | — | — | — | — | — | 0.4 | 0.8 |
| (F) | 0.4 | 0.4 | 0.4 | 0.4 | 0.4 | 0.4 | 0.4 | 0.4 | 0.4 | 0.4 | 0.4 | 0.4 |
| (G) | 0.4 | 0.4 | 0.4 | 0.4 | 0.4 | 0.4 | 0.4 | 0.4 | 0.4 | 0.4 | 0.4 | 0.4 |

Property Evaluation (1) Electrical Properties

Each of the compositions for solar cell electrodes prepared in Examples 1 to 3 and Comparative Examples 1 to 9 was deposited over a front surface of a wafer (a multicrystalline wafer prepared by texturing a front surface of a p-type wafer doped with boron (B), forming an $n^+$ layer of $POCL_3$ on the textured surface, and forming an antireflective film of SiNx:H on the $n^+$ layer) by screen printing in a predetermined pattern, followed by drying in an IR drying furnace at 300° C. to 400° C. Then, an aluminum paste was printed on a back surface of the wafer and dried in the same manner as above. A cell formed according to this procedure was subjected to baking at a temperature of 400° C. to 950° C. for 30 to 50 seconds in a belt-type baking furnace, thereby fabricating a solar cell. The fabricated solar cell was evaluated as to short-circuit current (Isc), open-circuit voltage (Voc), contact resistance (Rs), fill factor (FF), and conversion efficiency (Eff.) using a solar cell efficiency tester (CT-801, Pasan Co., Ltd.).

(2) Adhesion to Substrate

Figure 2:
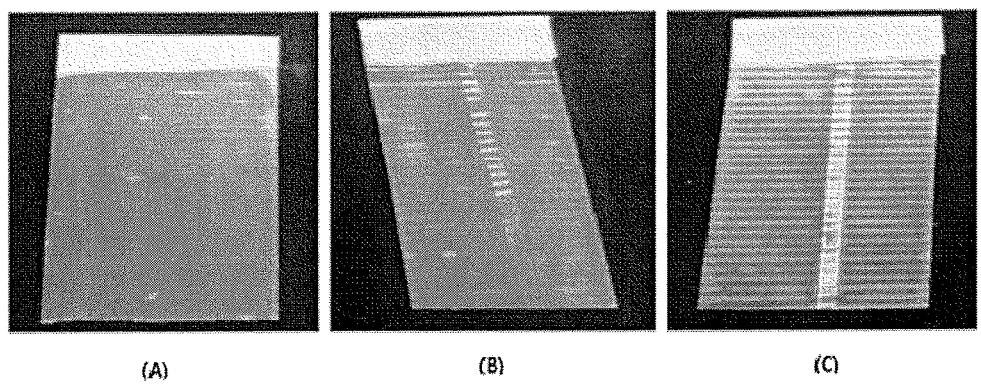
FIG. 2 illustrates images showing a degree of pattern peeling in a test for measurement of adhesive strength of an electrode to a substrate.

Each of the compositions for solar cell electrodes prepared in Examples 1 to 3 and Comparative Examples 1 to 9 was printed with a bus bar pattern on a wafer using a mesh screen (SAMBORN SCREEN, 360 mesh, line width: 40 μm), followed by drying in a belt-type baking furnace at 250° C. to 300° C. Then, 3M tape (3M, #610) was attached to and detached from the bus bar pattern, and whether the pattern was peeled off was observed with the naked eye. Here, the peeling test was conducted at a peeling angle of 250° and 300°. FIG. 2 illustrates images showing the degree of peeling of the bus bar pattern. When the bus bar pattern was hardly peeled off, as shown in (A) of FIG. 2, a composition sample was rated as ○; when the bus bar pattern was partially peeled off, as shown in (B) of FIG. 2, a composition sample was rated as Δ; and when the bus bar pattern was completely peeled off, as shown in (C) of FIG. 2, a composition sample was rated as x.

(3) Fine Line Width Printability

Each of the compositions for solar cell electrodes prepared in Examples 1 to 3 and Comparative Examples 1 to 9 was deposited over a front surface of a wafer by screen printing in a predetermined pattern using a screen mask (360 mesh, line width: 30 μm). After the wafer was subjected to drying and baking, the pattern of the wafer was observed using a three-dimensional microscope, followed by measurement of the number of disconnections using an EL analyzer.

TABLE 2

| | Isc. (A) | Voc. (mV) | Rs (ohm) | FF (%) | Eff. (%) | Adhesive strength 250° | Adhesive strength 300° | Printability (Number of disconnections) |
|---|---|---|---|---|---|---|---|---|
| Example 1 | 8.735 | 629.43 | 0.0055 | 76.54 | 17.32 | ○ | ○ | 0 |
| Example 2 | 8.727 | 628.52 | 0.0051 | 76.86 | 17.35 | ○ | ○ | 0 |
| Example 3 | 8.696 | 629.69 | 0.0054 | 77.01 | 17.35 | ○ | ○ | 0 |
| Comparative Example 1 | 8.720 | 626.83 | 0.0060 | 75.18 | 16.91 | Δ | Δ | 3 |
| Comparative Example 2 | 8.721 | 630.34 | 0.0061 | 75.23 | 17.02 | Δ | Δ | 2 |
| Comparative Example 3 | 8.758 | 629.85 | 0.0060 | 75.32 | 17.10 | Δ | ○ | 2 |
| Comparative Example 4 | 8.708 | 628.61 | 0.0071 | 74.01 | 16.67 | Δ | ○ | 3 |
| Comparative Example 5 | 8.724 | 630.12 | 0.0069 | 73.98 | 16.74 | Δ | ○ | 4 |
| Comparative Example 6 | 8.721 | 626.80 | 0.0056 | 75.86 | 17.06 | x | Δ | 3 |
| Comparative Example 7 | 8.725 | 626.99 | 0.0061 | 75.18 | 16.92 | x | Δ | 6 |
| Comparative Example 8 | 8.716 | 627.29 | 0.0055 | 75.56 | 17.00 | x | Δ | 5 |
| Comparative Example 9 | 8.713 | 627.14 | 0.0057 | 75.96 | 17.08 | x | Δ | 6 |

As shown in Table 2, it may be seen that the compositions for solar cell electrodes of Examples 1 to 3 including the epoxy-containing silicon compound exhibited excellent electrical properties and adhesive strength and did not suffer from disconnections when printed in a fine line width. The compositions for solar cell electrodes of Comparative Examples 1 to 9 not including the epoxy-containing silicon compound exhibited poor adhesion to a substrate and suffered from disconnections when printed in a fine line width.

By way of summation and review, as the glass fit, lead-containing glass could be used. The lead-containing glass may facilitate control of softening point and may exhibit excellent adhesion to the semiconductor substrate, and may have high contact resistance with the substrate, thereby causing poor solar cell efficiency.

Compositions for solar cell electrodes using a tellurium-containing glass frit capable of obtaining low contact resistance have been considered. Such compositions for solar cell electrodes using a tellurium-containing glass frit may have poor adhesion to a semiconductor substrate and may not provide sufficient durability. Accordingly, a method of adding tungsten to tellurium-containing glass or using a glass fit containing both lead and tellurium has been considered. In this method, adhesion to the substrate may be improved, and a deterioration in contact resistance could occur. It could be difficult to realize excellent properties in terms of both adhesion to the substrate and contact resistance.

In order to increase solar cell efficiency, the thickness of an emitter layer and the line width of an electrode may be continuously reduced. Continuous reduction in emitter thickness could cause frequent shunting, which may lead to deterioration in solar cell performance. In addition, reduction in line width of the electrode could cause an increase in disconnection frequency.

A composition for solar cell electrodes may have sufficiently low contact resistance under various sheet resistances while minimizing influence on a p-n junction, may exhibit excellent adhesion to a substrate, and may help minimize disconnection when printed in a fine line width.

The embodiments may provide a composition for solar cell electrodes that uses a rapid-curable resin such as an epoxy group-containing silicon resin, thereby improving adhesion of an electrode to a substrate.

The embodiments may provide a composition for solar cell electrodes having excellent adhesion to a substrate, realizing low contact resistance, and minimizing disconnection when printed in a fine line width.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A composition for solar cell electrodes, the composition comprising:
    silver powder;
    glass frit;
    an organic vehicle; and
    an epoxy group-containing silicon compound,
    wherein:
    the glass frit includes bismuth and tellurium,
    the organic vehicle includes a cellulose resin, and
    the epoxy group-containing silicon compound is present in an amount of about 0.2 wt % to about 0.6 wt %, based on a total weight of the composition.

2. The composition for solar cell electrodes as claimed in claim 1, wherein the cellulose resin includes hydroxy cellulose, methyl cellulose, ethyl cellulose, or nitrocellulose.

3. The composition for solar cell electrodes as claimed in claim 1, wherein a weight ratio of the cellulose resin to the epoxy group-containing silicon compound is about 3:7 to about 8:2.

4. The composition for solar cell electrodes as claimed in claim 1, wherein the glass frit further includes at least one of lithium and zinc.

5. The composition for solar cell electrodes as claimed in claim 1, wherein the glass frit includes Bi—Te—Li—O glass frit, Bi—Te—Zn—O glass frit, or Bi—Te—Li—Zn—O glass frit.

6. The composition for solar cell electrodes as claimed in claim 1, wherein the composition includes:
    about 60 wt % to about 95 wt % of the silver powder;
    about 0.1 wt % to about 20 wt % of the glass frit;
    about 1 wt % to about 30 wt % of the organic vehicle; and
    the about 0.2 wt % to about 0.6 wt % of the epoxy group-containing silicon compound, all wt % being based on a total weight of the composition.

7. The composition for solar cell electrodes as claimed in claim 1, further comprising a dispersant, a thixotropic agent, a plasticizer, a viscosity stabilizer, an anti-foaming agent, a pigment, a UV stabilizer, an antioxidant, or a coupling agent.

8. A solar cell electrode prepared from the composition for solar cell electrodes as claimed in claim 1.

9. A solar cell including the solar cell electrode as claimed in claim 8.

* * * * *